United States Patent [19]
Sasaki et al.

[11] Patent Number: 5,234,499
[45] Date of Patent: Aug. 10, 1993

[54] SPIN COATING APPARATUS

[75] Inventors: Tadashi Sasaki; Yoshio Okamoto; Koji Kizaki, all Kyoto, Japan

[73] Assignee: Dainippon Screen Mgf. Co., Ltd., Kyoto, Japan

[21] Appl. No.: 719,203

[22] Filed: Jun. 21, 1991

[30] Foreign Application Priority Data

Jun. 26, 1990 [JP] Japan .................................. 2-167321
Jul. 6, 1990 [JP] Japan .................................. 2-179974

[51] Int. Cl.⁵ ............................................. B05C 11/02
[52] U.S. Cl. ........................................ 118/52; 118/56; 427/240
[58] Field of Search .................... 118/52, 56, 708, 501; 427/240, 4; 134/902, 153; 156/345

[56] References Cited

U.S. PATENT DOCUMENTS

| | | | |
|---|---|---|---|
| 4,201,149 | 5/1980 | Koester et al. | 118/56 |
| 4,519,846 | 5/1985 | Aigo | 134/902 |
| 4,735,220 | 4/1988 | Chandler | 134/902 |
| 4,889,069 | 12/1989 | Kawakami | 118/50 |

FOREIGN PATENT DOCUMENTS

| | | | |
|---|---|---|---|
| 0113265 | 9/1979 | Japan | 118/52 |
| 58-4588 | 1/1983 | Japan . | |
| 58-19350 | 4/1983 | Japan . | |
| 0111320 | 7/1983 | Japan | 118/52 |
| 0132930 | 8/1983 | Japan | 118/52 |
| 0087069 | 5/1984 | Japan | 118/52 |
| 60-143871 | 7/1985 | Japan . | |
| 0023539 | 1/1989 | Japan | 134/902 |
| 0057721 | 3/1989 | Japan | 134/902 |
| 1-135565 | 5/1989 | Japan . | |
| 57-48980 | 10/1992 | Japan . | |

*Primary Examiner*—W. Gary Jones
*Assistant Examiner*—Brenda Lamb
*Attorney, Agent, or Firm*—Lowe, Price, LeBlanc & Becker

[57] ABSTRACT

A spin coating apparatus for use in applying a coating solution in film form to an upper surface of a substrate. This apparatus includes a rotary table for spinning the substrate as supported thereon in horizontal posture, the rotary table having a size larger than an outline contour of the substrate, and an upper rotary plate disposed parallel to and slightly spaced from the upper surface of the substrate supported on the rotary table. The rotary table and upper rotary plate define a flat treating space therebetween, which treating space has peripheral openings for allowing superfluous part of the coating solution to scatter outwardly therefrom. A nozzle plate is disposed between the rotary table and the substrate supported thereon. The nozzle plate receives cleaning liquid supplied through a rotary shaft of the rotary table, and directs the liquid to the lower surface of the substrate.

11 Claims, 10 Drawing Sheets

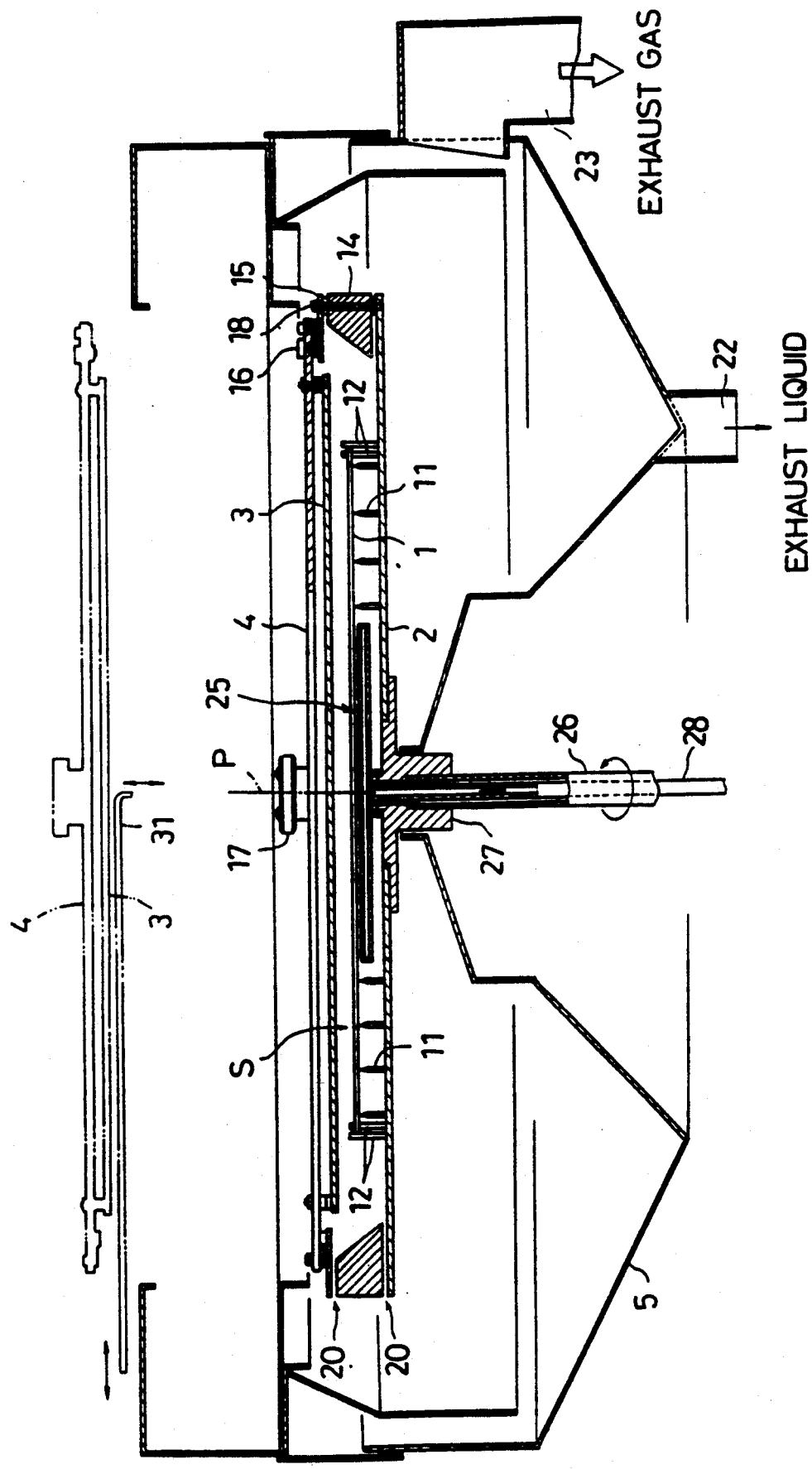

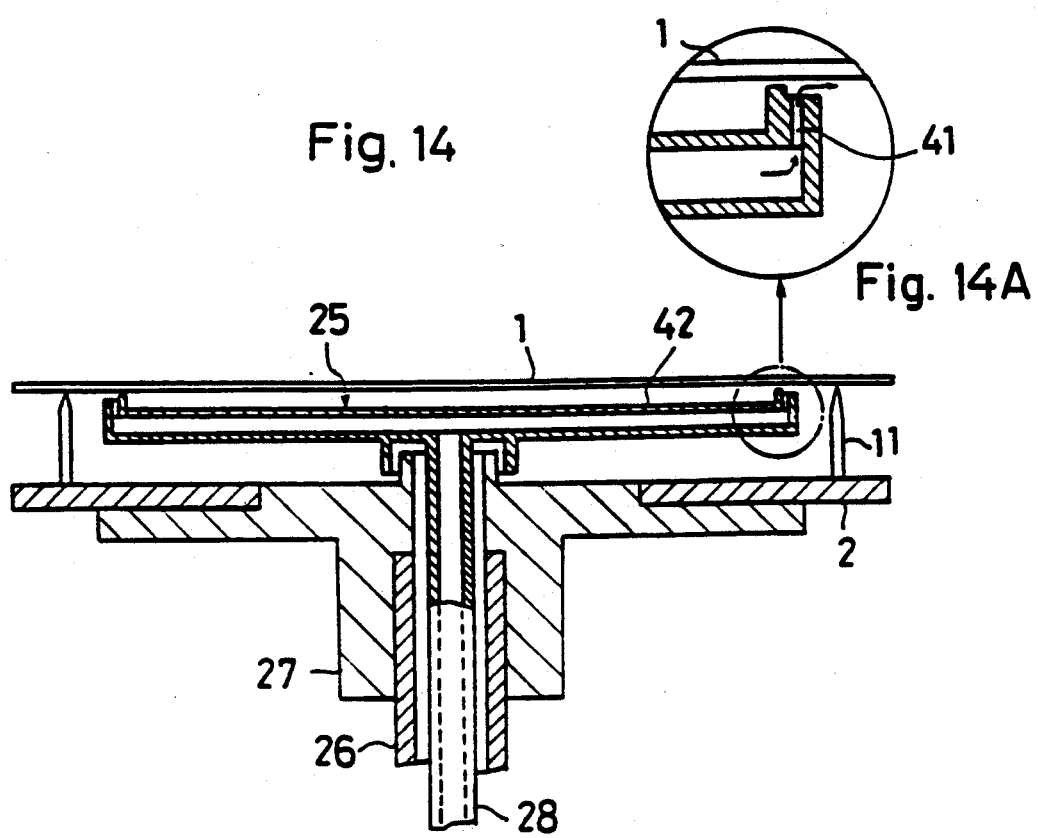
Fig. 14
Fig. 14A
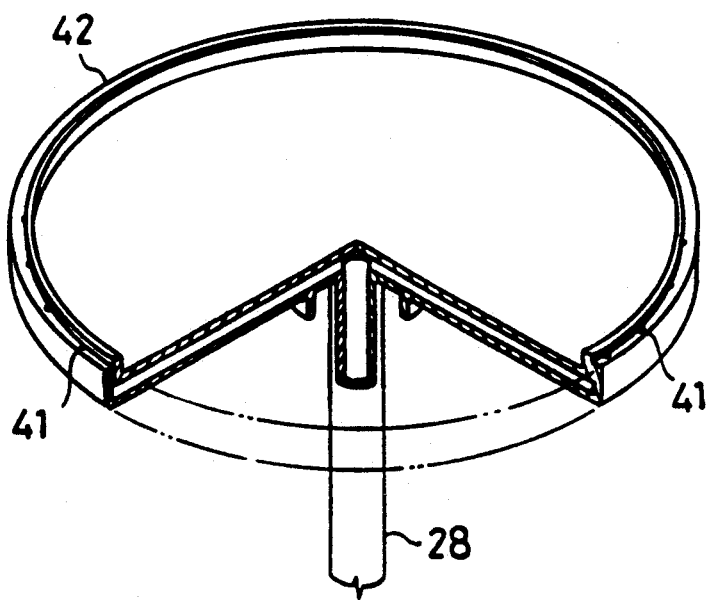
Fig. 15

SPIN COATING APPARATUS

BACKGROUND OF THE INVENTION (1) Field of the Invention

The present invention relates to spin coating apparatus for use in applying a photoresist or other coating solution in film form to surfaces of substrates such as glass substrates for liquid crystal displays, semiconductor wafers or mask substrates in the manufacture of semiconductor devices.

(2) Description of the Related Art

The spin coating apparatus applies a coating solution to a spinning substrate, and the solution is spread over the substrate by the centrifugal force. In the case of a square substrate, the resulting film tends to be thicker in the corners than in other parts of the substrate.

This is because the corners of a square substrate in a spin cut through ambient air or gas, and are exposed to the air more than other parts of the substrate. As a result, evaporation of the solvent portion of the coating solution is promoted in the corners to increase viscosity of the solution and diminish the spreading effect of the centrifugal force. In the case of a round substrate, the larger the substrate is, the greater is the difference in circumferential speed between a radially outward position and a radially inward position of the substrate. Thus, the tendency to increase the film thickness in peripheral regions is not negligible.

Spin coating apparatus devised to solve the problem encountered with square or large substrates are disclosed in (1) Japanese Patent Publication (Examined) No. 1982-48980, (2) Japanese Patent Publication (Examined) No. 1983-4588, and (3) Japanese Patent Publication Kokai (Unexamined) No. 1989-135565. Such a known apparatus includes a rotary container surrounding a substrate placed in a horizontal posture on a rotary table. The rotary container is rotatable synchronously with the substrate to which a coating solution is applied and spread by the centrifugal force to form a thin film on an upper surface of the substrate.

In the apparatus disclosed in the above three publications, the substrate is invariably enclosed so as to be gastight or approximately gastight in and spun with the container. The spinning substrate is maintained in an atmosphere of the solvent evaporating from the coating solution. In this way, partial gasification of the solvent in the corners of a square substrate, for example, is suppressed. This produces a certain effect of avoiding the film being formed thicker in the corners or peripheries than in inward regions of the substrate as a result of contact with the atmosphere inside the container.

However, the conventional apparatus noted above have the following disadvantages:

(1) In the apparatus disclosed in the Japanese publications (1) and (2) above, because the substrate is enclosed gastight in the rotary container rotatable synchronously with the substrate, superfluous part of the coating solution accumulates in the rotary container. Therefore, an operation must be carried out to remove the superfluous coating solution from the rotary container. For this purpose, the spin coating process may have to be discontinued temporarily, which presents difficulties in successively processing a large number of substrates through the spin coating treatment.

(2) The apparatus in the Japanese publication (3) noted above overcomes the disadvantage relating to continuity of the spin coating process by providing pores or tubes in the bottom of the rotary container for draining superfluous part of the coating solution. However, if the pores or tubes have too small an opening area, the superfluous coating solution is removed only insufficiently, thereby increasing the quantity of mist in the container. Conversely, if the opening area is too large, the solvent gas becomes unevenly distributed in the atmosphere inside the container. It is thus difficult to obtain a uniform film thickness from the spin coating process.

(3) In the apparatus disclosed in the three Japanese publications, the rotary container has a hermetic sealing or approximately gastight construction in order to secure, around the substrate, a uniform atmosphere of the solvent evaporating from the coating solution. Consequently, mist of the coating solution generated with the spin (the coating solution scattering from the substrate and breaking into droplets which float in the air) remains adrift in the rotary container. This means that the substrate lies in a space filled with mist of the coating solution. It gives rise to the problem that the upper and lower surfaces of the substrate are contaminated by the mist. An additional process of cleaning the lower surface of the substrate following application of the coating solution would not only result in an increase in the number of manufacturing steps to lower productivity, but poses a different problem of requiring equipment and running costs for the cleaning process.

(4) The problem of the mist of the coating solution contaminating the substrate does not arise with open type spin coating apparatus that carry out a coating treatment while an area upwardly of a substrate is left open, since the substrate is not hermetically sealed or enclosed approximately gastight in the rotary container. However, as noted hereinbefore, a uniform film thickness cannot be obtained owing to gasification of the solvent in the coating solution which is promoted by the peripheries of the substrate cutting through the atmosphere.

(5) In the case of a square substrate, superfluous part of the coating solution scattering from mid-positions of linear sides could adhere to undersurfaces in the corners of the substrate when passing under the corners immediately after scattering from the sides. In the case of a semiconductor wafer, superfluous coating solution scattering from a mid-position of an orientation flat could adhere to an undersurface of the boundary between an arcuate portion and the orientation flat when passing under the boundary immediately after scattering from the flat. As exemplified by the scattering superfluous coating solution, the lower surface of the substrate is contaminated also by causes other than the mist of the coating solution noted in the paragraph (3) above. An apparatus devised to prevent the contamination of the lower surface of the substrate is disclosed in Japanese Patent Publication (Examined) No. 1983-19350, for example. This apparatus is an open type spin coating apparatus as noted hereinbefore, and includes a nozzle disposed adjacent a rotary table on which a substrate is supported. The nozzle is used to direct cleaning liquid to the lower surface of the spinning substrate under the coating treatment, thereby preventing the coating solution from adhering to the lower surface of the substrate. However, in the case of closed type spin coating apparatus that applies a coating solution to a substrate placed in a sealed rotary container, it is difficult by reason of the structure to fix a nozzle inside the rotary container.

Among spin coating apparatus suited for treating large or square substrates, there is no apparatus yet that effectively prevents the coating solution from drifting to the lower surface of the substrate, though such an apparatus has been desired.

(6) The closed type spin coating apparatuses disclosed in the Japanese publications (1) and (2) have the function to produce a "uniform atmosphere of the solvent evaporating from the coating solution" around a substrate, which is achieved by means of the rotary container surrounding the substrate in a gastight condition and rotatable synchronously with the substrate. This is designed to prevent promotion of partial gasification of the solvent in the coating solution, to thereby realize a uniform film thickness. However, it is difficult to apply the coating solution uniformly if the rotary container is closed incompletely after a substrate is placed therein or if packing or the like is defective.

SUMMARY OF THE INVENTION

The present invention has been made having regard to the state of the art noted above, and has for an object to provide a spin coating apparatus which positively eliminates the non-uniformity of film thickness due to gas flows generated by a spinning square or large substrate.

Another object of the present invention is to provide a spin coating apparatus which is capable of a continuous spin coating operation made possible by eliminating discontinuation of the spin coating process for removal of superfluous part of a coating solution from a rotary container provided to enclose a substrate in a gastight condition filled with vapor of the solvent component of the coating solution as in the Japanese publications (1) and (2) noted hereinbefore.

A further object of the present invention is to provide a spin coating apparatus which is capable of applying spin coating in a uniform thickness in a stable manner by eliminating the instability that vapor of the solvent component of the coating solution lacks in uniformity around a substrate due to the size of pores or openings of tubes defined in or attached to a rotary container provided to enclose the substrate in a gastight condition filled with the vapor of the solvent component of the coating solution as in the Japanese publication (3) noted hereinbefore.

A still further object of the present invention is to provide a spin coating apparatus which maintains a substrate free from contamination by mist of a coating solution by eliminating the condition in which the substrate receives a spin coating treatment in a space filled with the mist of the coating solution as in the prior art in which the substrate is enclosed in a rotary container.

A still further object of the present invention is to provide a spin coating apparatus which is capable of applying a film of uniform thickness to a square or large substrate while preventing superfluous part of a coating solution scattering from the substrate from adhering to the lower surface of the substrate.

the foregoing objects are fulfilled, according to the present invention, by the following constructions:

In accordance with an aspect of the present invention, there is provided a spin coating apparatus for applying a coating solution to form an even film on an upper surface of a substrate, comprising;

means for supplying a flow of said coating solution to said upper surface of said substrate;

lower spin means for supporting and spinning said substrate in a horizontal posture about a spin axis, said lower spin means having a size larger than an outline contour of said substrate; and upper spin means for providing a planar portion having a size larger than the outline contour of said substrate and disposed parallel to and slightly spaced from the upper surface of said substrate supported on said lower spin means, said upper spin means being rotatable about said spin axis with said lower spin means, wherein said lower spin means and said upper spin means cooperate to define a flat treating space therebetween, said flat treating space having a size larger than the outline contour of said substrate and having peripheral openings for allowing a superfluous part of said coating solution flow to scatter outwardly therefrom.

In the above construction, a layer of air in the flat treating space between the spinning device and upper spinning device spins with the spinning devices from the start of their spin as it is sandwiched tight between the upper and lower spinning devices. Since no air current is generated on the upper surface of the substrate lying in the treating space, there no partial increase in the film thickness occurs due to an increase in the viscosity of the coating solution resulting from promotion of partial gasification of the solvent in the coating solution. Consequently, the coating solution is applied in a uniform film thickness.

The treating space is open radially outwardly, which allows mist resulting from superfluous coating solution to flow out of this space quickly. The mist of the superfluous coating solution once discharged from the treating space is prevented from flowing back into this space in the absence of air flowing in and out of the treating space. This minimizes the inconvenience of the mist of the coating solution adhering to and contaminating the substrate.

Since the superfluous coating solution does not remain in the treating space, this apparatus does not require an operation to remove the accumulating superfluous coating solution as in the conventional apparatus which enclose the substrate in a gastight condition inside a rotary container. Thus, the apparatus according to the present invention is suited for a continuous coating process to realize high productivity.

A space outside the treating space may be in any form since the superfluous coating solution flows out only under a centrifugal force. Thus, a waste liquid treating mode may be selected freely as desired.

In accordance with another aspect of the invention, there is provided a spin coating apparatus for applying a flow of a coating solution to form an even film on an upper surface of a substrate and for cleaning a lower surface of the substrate, comprising:

lower spin means, having a spin axis, for spinning said substrate while supporting the substrate thereon in a horizontal posture, said lower spin means having a rotary shaft and being of a size larger than an outline contour of said substrate, said substrate extending across said spin axis;

substrate supporting means formed on said lower spin means to define a space between an upper surface of said lower spin means and the lower surface of said substrate;

upper spin means disposed parallel to and slightly spaced from the upper surface of said substrate supported on said substrate supporting means, said upper spin means being rotatable with said lower spin means about said spin axis and including a planar portion having a size larger than the outline contour of said substrate; and cleaning liquid supply means for supplying a flow of a cleaning liquid through said rotary shaft of said lower spin means and for directing the flow of cleaning liquid to the lower surface of said substrate supported on said substrate supporting means, wherein said lower spin means and said upper spin means cooperate to define a rotating flat treating space therebetween, said treating space having peripheral openings for allowing a superfluous part of said coating solution flow to scatter outwardly therefrom.

With this construction, even if superfluous coating solution scattering from the upper surface of the substrate should flow round to the lower surface of the substrate, the cleaning liquid delivered through the rotary shaft of the spinning device to the lower surface of the substrate would wash away the coating solution adhering to the lower surface or prevent the superfluous coating solution entering between the lower surface of the substrate and the spinning device from adhering to the lower surface. Thus, the substrate is maintained clean. Since the cleaning liquid is supplied through the rotary shaft of the spinning device, the cleaning liquid may readily be directed to the lower surface of the substrate in spite of the narrow treating space.

BRIEF DESCRIPTION OF THE DRAWINGS

For the purpose of illustrating the invention, there are shown in the drawings several embodiments which are presently preferred, it being understood, however, that the invention is not limited to the precise arrangements and instrumentalities shown.

FIG. 5 is a view in vertical section of an entire spin coating apparatus in a second embodiment of the invention;

FIG. 14 is a fragmentary view in vertical section of a further modified cleaning liquid supply mechanism;

FIG. 15 is a perspective view, partly broken away, of a nozzle plate; and

DETAILED DESCRIPTION OF THE PREFERRED EMBODIMENTS

Preferred embodiments of the present invention will be described in detail hereinafter with reference to the drawings.

First Embodiment

Figure 1:
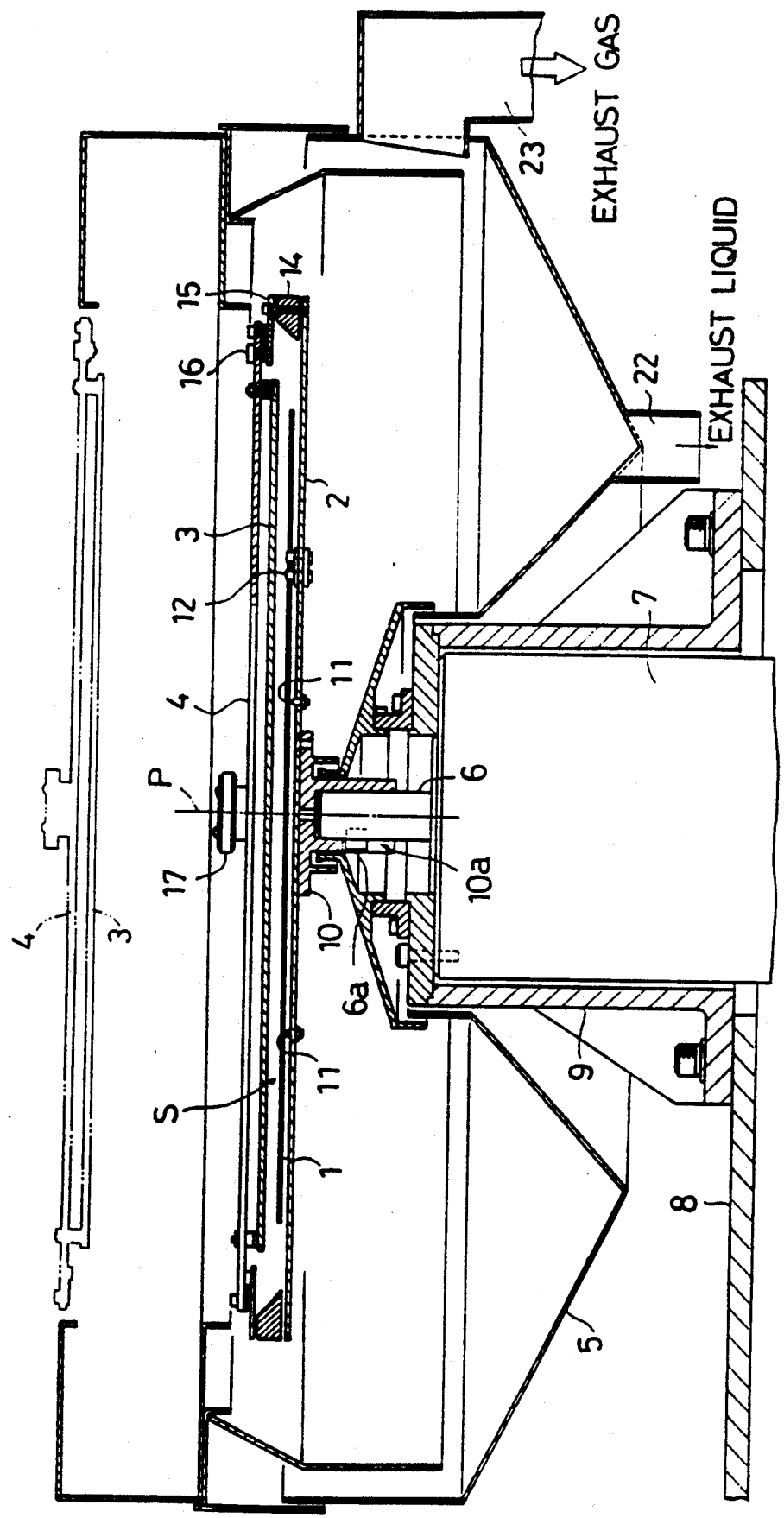
FIG. 1 is a view in vertical section of an entire spin coating apparatus in a first embodiment of the present invention.
Figure 2:
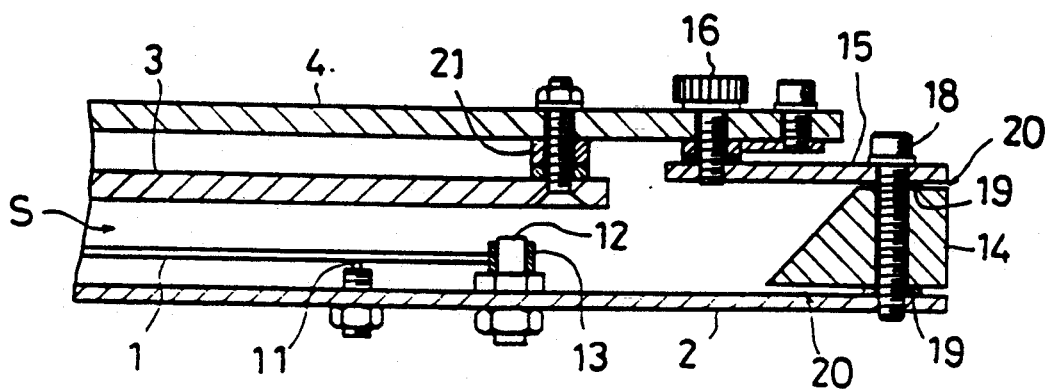
FIG. 2 is a fragmentary view in vertical section of the spin coating apparatus.
Figure 3:
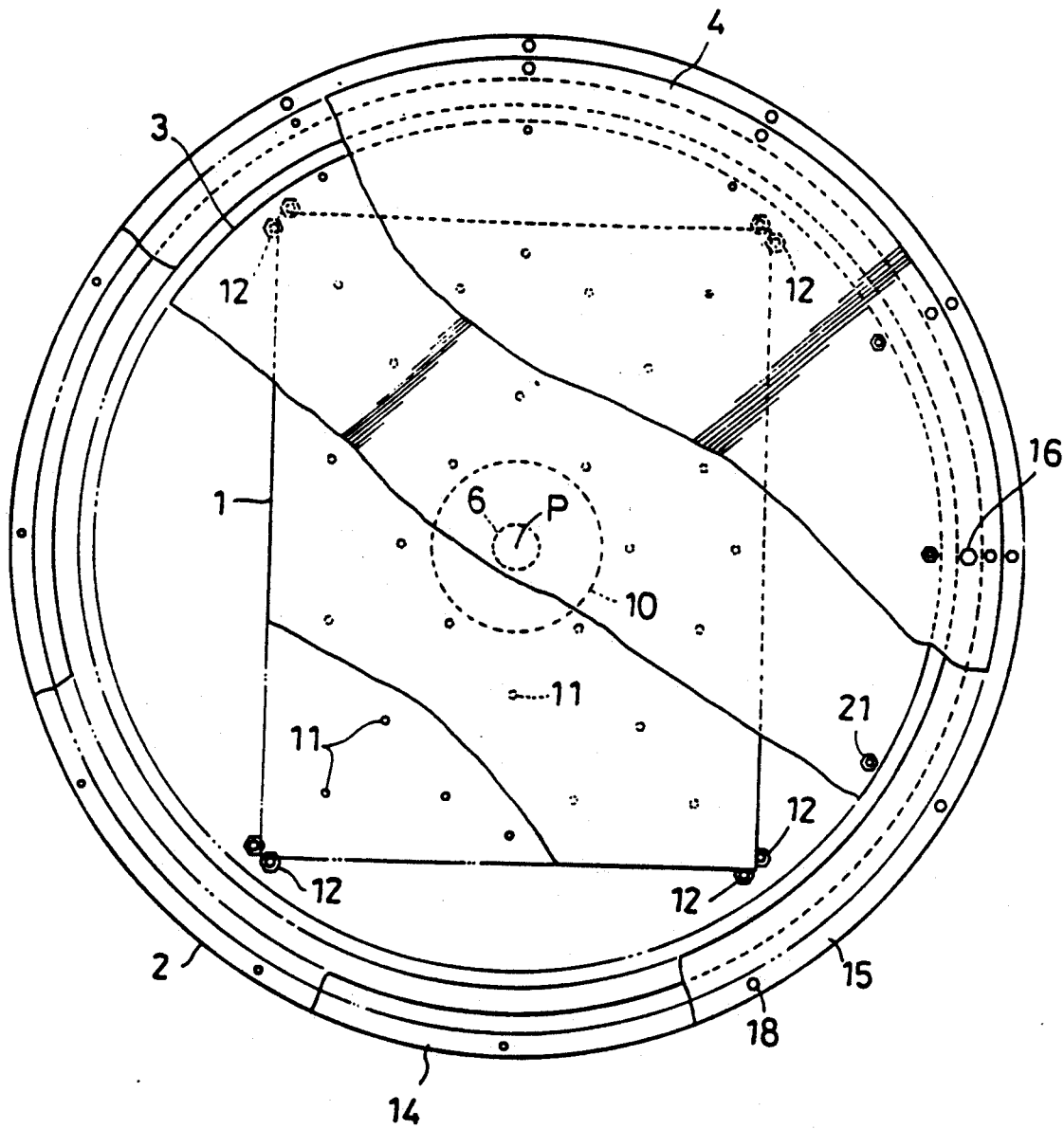
FIG. 3 is a plan view, partly broken away, showing a substrate mounted in position.

FIGS. 1 through 3 show a spin coating apparatus in a first embodiment of the invention.

This spin coating apparatus comprises a rotary table 2 rotatable horizontally about a vertical axis P with a square substrate 1 supported thereon, an upper rotary plate 3 parallel to and rotatable with the rotary table 2, an upper support plate 4 for supporting the upper rotary plate 3, a waste liquid collecting case 5 surrounding lower and peripheral regions of these rotatable components, and a motor 7 having a vertical rotary shaft or output shaft 6.

The motor 7 is connected to and supported by a bracket 9 mounted on a base plate 8. The rotary table 2 has a boss 10 provided centrally of a lower surface thereof and extending downwardly to fit over the vertical rotary shaft 6. The rotary shaft 6 carries a drive pin 6a engaged with a cutout 10a formed in the boss 10 to effect torque transmission.

The rotary table 2 is in the form of a disk having a size well in excess of an outline contour of the substrate 1. The substrate 1 is supported in horizontal posture on a plurality of substrate supporting pins 11 erected on an upper surface of the rotary table 2. The rotary table 2 further includes four pairs of engaging pins 12, one pair engaging each of the four corners of the rotary table 2. These pins 12 cause the substrate 1 to spin horizontally with the rotary table 2. As shown in FIG. 2, each engaging pin 12 has a plastic collar 13 fitted thereon to protect an edge of the rotary table 2 from damage.

The rotary table 2 carries a spacer ring 14 and a ring plate 15, both having the same outside diameter as the rotary table 2, stacked in the stated order and connected at a plurality of positions to the rotary table 2. The upper support plate 4 is detachably attached to the ring plate 15 by knob bolts 16. With the upper support plate 4 detached, the substrate 1 may be transported in and out through the center opening of the ring plate 15. The upper support plate 4 has a knob 17 formed centrally of an upper surface thereof for moving the support plate 4 relative to the ring plate 15.

The spacer ring 14 has a trapezoidal section, and defines upper and lower gaps 20 for allowing outflow of waste liquid. These gaps 20 correspond to a thickness of upper and lower washers 19 fitted on connecting bolts 18.

The upper rotary plate 3 is in the form of a disk having a diameter greater than the outline contour of the substrate 1, and is bolted to a lower surface of the upper support plate 4 through collars 21. The space between the substrate 1 and upper rotary plate 3, i.e. between the upper surface of the substrate 1 and the lower surface of the upper rotary plate 3, does not exceed 50 mm regardless of the size of the substrate 1. This space should be as narrow as permissible, taking warping of the substrate 1 and other conditions into account. A space of about 10 mm is desirable for practical purposes where the substrate is 300 mm square, for example.

The waste liquid collecting case 5 has a tapered bottom defining a liquid drain 22 at a lower end thereof. Further, the case 5 includes a plurality of exhaust openings 23 peripherally thereof for releasing a solvent gas evaporating from a coating solution and mist of the coating solution.

In a coating process with the spin coating apparatus in this embodiment as constructed above, the upper support plate 4 is removed first, and the substrate 1 is set in a predetermined posture on the substrate supporting pins 11 of the rotary table 2.

Next, a coating solution supplying nozzle not shown is moved to a position centrally and upwardly of the substrate 1, and the coating solution is dripped in a predetermined quantity.

Subsequently, the upper support plate 4 is fixed to the ring plate 15, and the motor 7 is started to spin the rotary table 2, upper support plate 4, upper rotary plate 3 and substrate 1 all together horizontally.

With this spin, the coating solution is spread outwardly over the substrate 1 by the centrifugal force thereby generated, to be coated thin on the upper surface of the substrate 1.

At this time, a layer of air in the space, i.e. coating treatment space S, between the rotary table 2 and upper rotary plate 3 spins therewith. Consequently, the coating solution is spread over the substrate 1 free of air flows.

Superfluous coating solution reaching outer peripheries of the substrate 1 flows off the peripheries to scatter from all peripheral regions of the coating treatment space S. The scattering coating solution and mist of the coating solution generating therefrom pass through the gaps 20 defined over and under the spacer ring 14, to be collected in the waste liquid collecting case 5.

Figure 4:
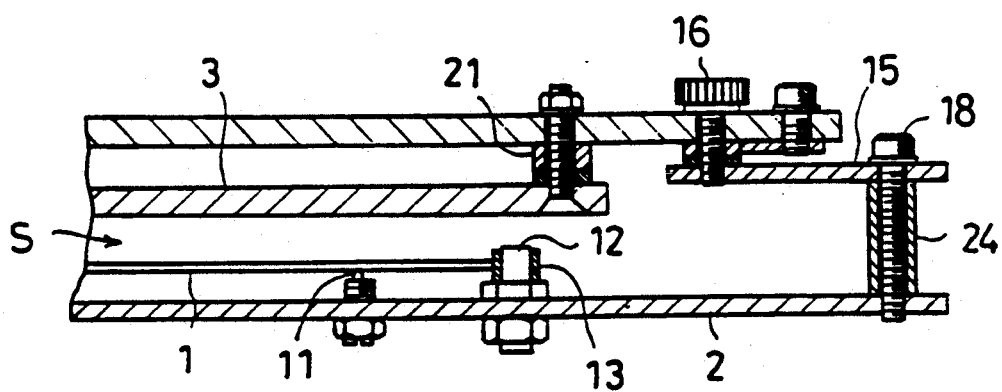
FIG. 4 is a fragmentary view in vertical section of a modified spin coating apparatus.

In the described embodiment, the ring plate 15 is connected to the rotary table 2 through the spacer ring 14 and bolts 18. Alternatively, spacer pipes 24 may be employed as shown in FIG. 4, which results in large openings all around between the rotary table 2 and ring plate 15. This construction allows the superfluous coating solution and vapor of the solvent to flow from the coating treatment space S directly into the waste liquid collecting case.

It is not absolutely necessary for the upper rotary plate 3 to be attached to the ring plate 15 through the upper support plate 4. For example, the upper rotary plate 3 may have an increased diameter, with an appropriate peripheral configuration, to be attached directly to the ring plate 15. However, the upper support plate 4 must be detachable for transporting the substrate 1 to and from the rotary table 2 and supplying the coating solution.

The device for holding the substrate 1 on the rotary table 2 is not limited to the above embodiment, but a vacuum chuck system may be employed instead.

Second Embodiment

Figure 6:
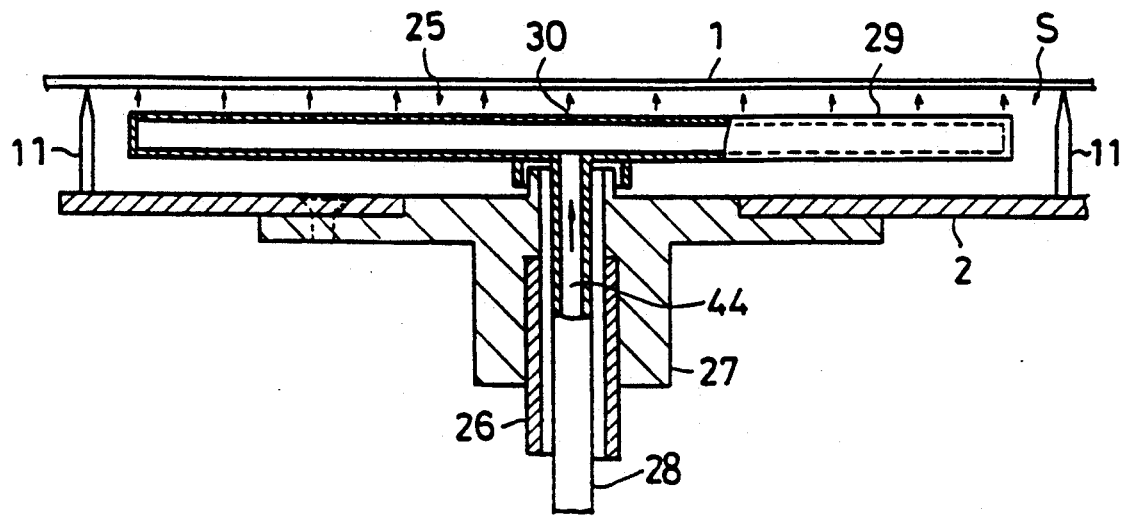
FIG. 6 is a view in vertical section of a cleaning liquid supply mechanism.
Figure 7:
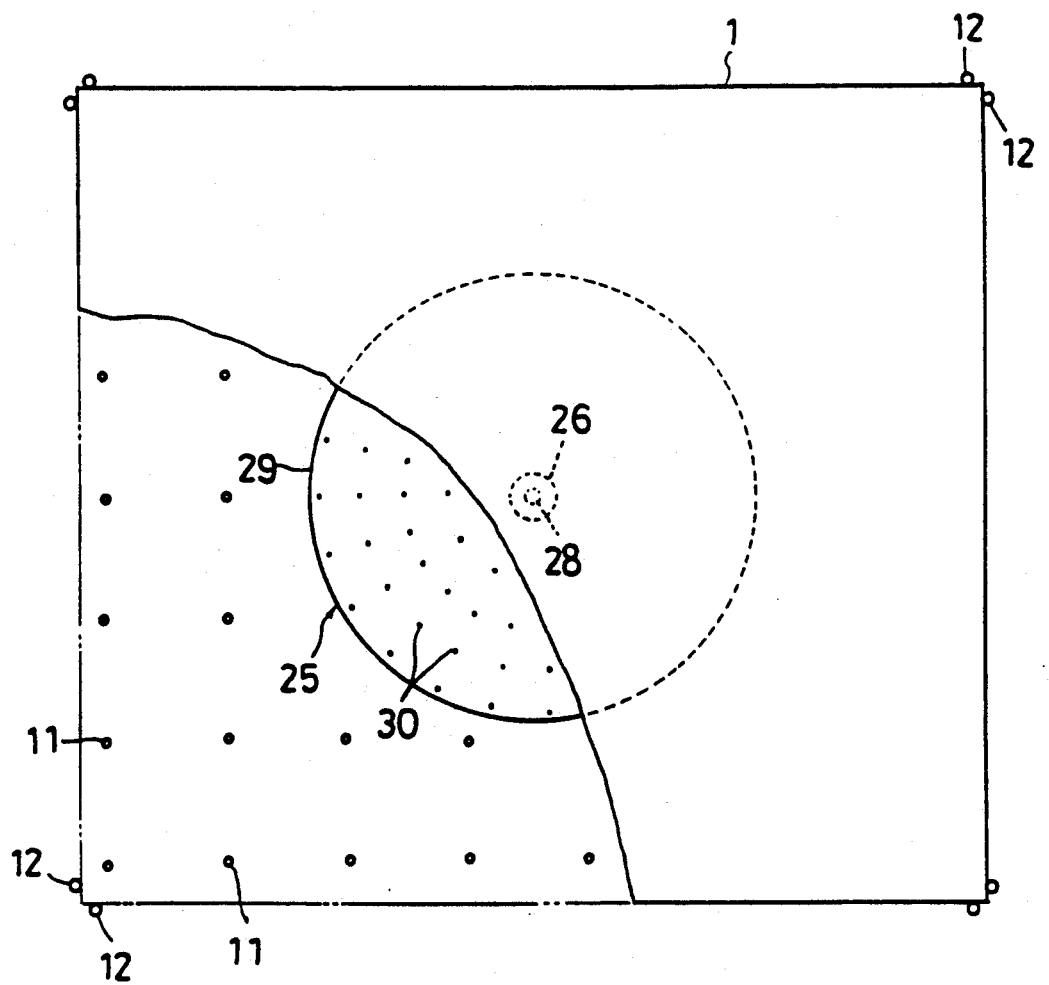
FIG. 7 is a plan view, partly broken away, showing a substrate mounted in position.

FIGS. 5 through 7 show a spin coating apparatus in a second embodiment of the invention. In these drawings, like references are used to identify like components in the first embodiment illustrated in FIGS. 1 through 4, and their description will not be repeated.

This embodiment is characterized by a cleaning liquid supply mechanism 25 for directing cleaning liquid to the lower surface of the substrate 1. This supply mechanism 25 is disposed centrally under and only slightly spaced from the substrate 1 supported by the numerous substrate supporting pins 11 erected on the rotary table 2. The rotary table 2 is mounted in a horizontal posture through a connecting boss 27 on an upper end of a tubular rotary shaft 26 extending vertically.

The cleaning liquid supply mechanism 25 includes a cleaning liquid supply tube 28 which is not rotatable and extends axially through the tubular rotary shaft 26, and a hollow nozzle plate 29 fixed to an upper end of the supply tube 28. The nozzle plate 29 defines numerous supply openings 30 through an upper surface thereof to direct the cleaning liquid to the lower surface of the substrate 1.

In a coating process with the spin coating apparatus in this embodiment as constructed above, the upper support plate 4 is lifted by appropriate means first, to fully expose the center opening. Then the substrate 1 is set in horizontal posture on the substrate supporting pins 11.

Next, a coating solution supply nozzle 31 as shown in FIG. 5 is moved to a position centrally of the center opening, and lowered to an appropriate height above the substrate 1. Thereafter the coating solution is dripped in a predetermined quantity on a central position of the substrate 1.

Subsequently, the nozzle 31 is retracted and the upper support plate 4 is fixed to the ring plate 15. Then the rotary shaft 26 is driven to spin the substrate 1 horizontally with the rotary table 2, upper support plate 4 and upper rotary plate 3. With this spin, the coating solution is spread outwardly over the substrate 1 to be coated thin on the upper surface of the substrate 1. At this time, the air sandwiched in the coating treatment space S between the rotary table 2 and upper rotary plate 3 spins with the substrate 1. Consequently, as in the first embodiment, the coating solution is spread over the substrate 1 without the edges of the substrate 1 cutting through the air.

During the spin coating treatment or after this treatment, the cleaning liquid supply mechanism 25 directs the cleaning liquid to the lower surface of the spinning substrate 1. Then the cleaning liquid flows from the central position outwardly over the lower surface of the substrate 1, and washes away the coating solution once having scattered from the substrate 1 and now adhering to the lower surface of the substrate 1 as well as the superfluous coating solution floating under the corners of the substrate 1 and about to adhere to undersurfaces of the corners immediately after scattering from the substrate 1. The resulting waste liquid passes through the gaps 20 defined by the spacer ring 14, into in the waste liquid collecting case 5 to be discharged through the drain 22.

Several modifications of this embodiment will be described next.

Figure 8:
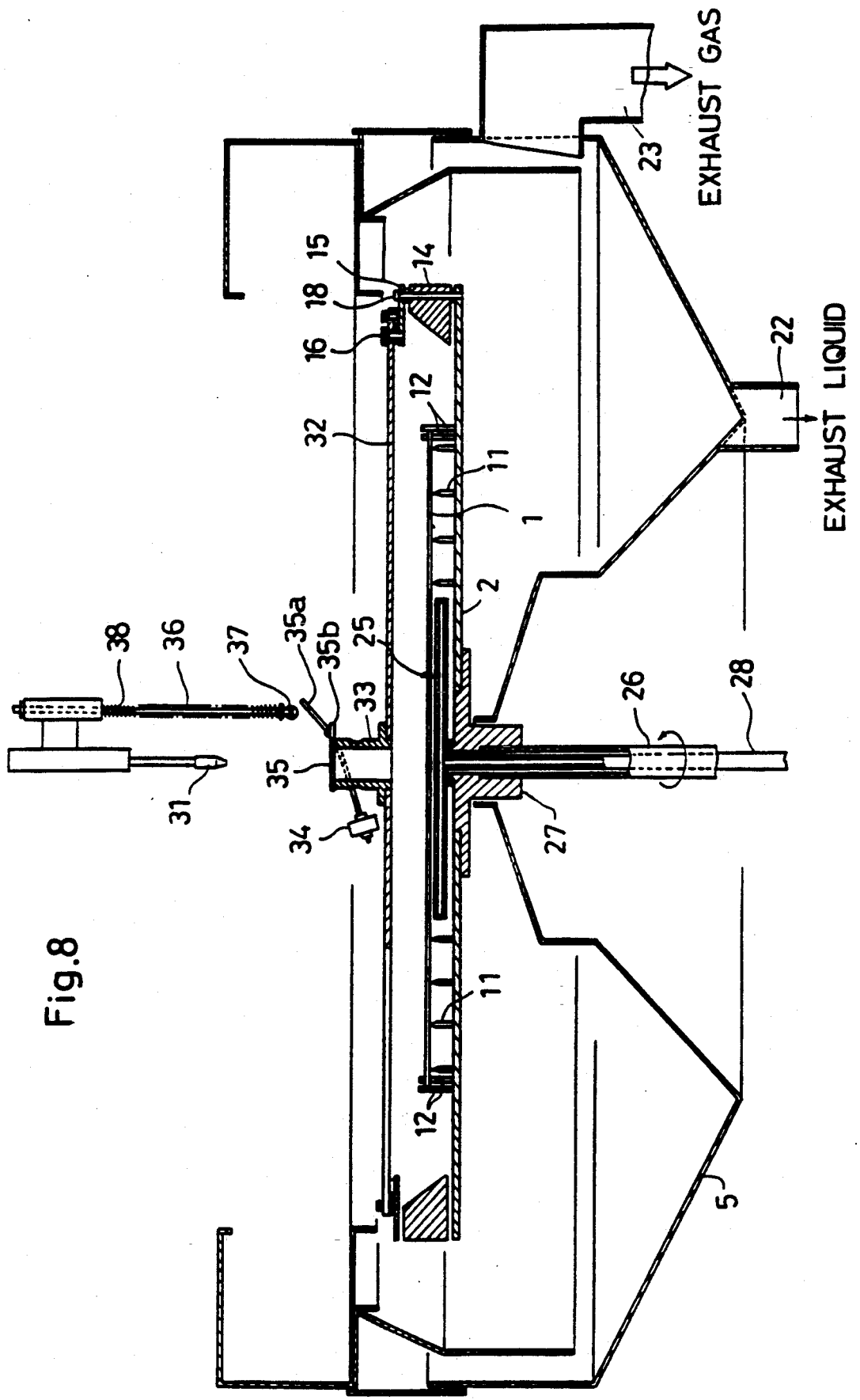
FIG. 8 is a view in vertical section of an entire spin coating apparatus having a modified coating solution supplying device.

FIG. 8 shows one example in which the upper support plate is not provided and an upper rotary plate 32 is attached directly to the ring plate 15. The coating solution may be supplied with the upper rotary plate 3 placed in a closed position.

Figure 9:
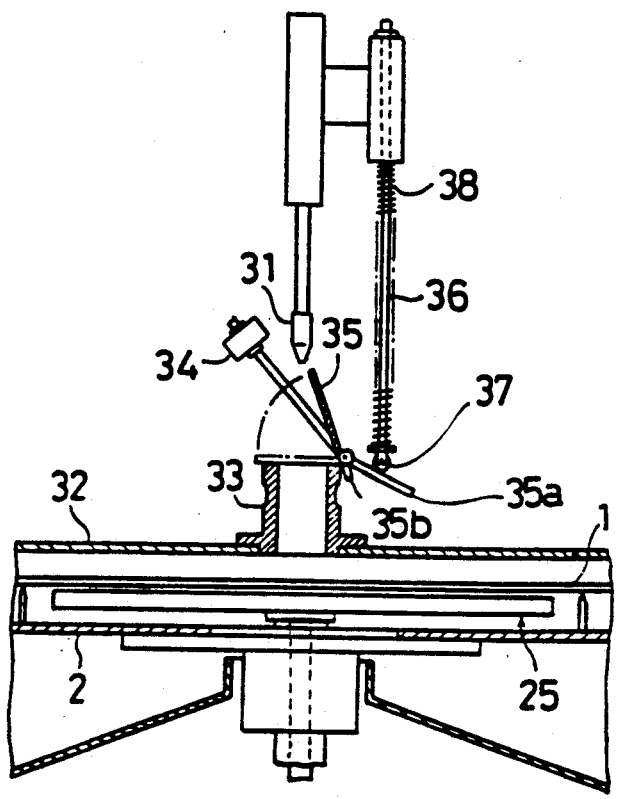
FIGS. 9 and 10 are fragmentary views illustrating operation of a coating solution supplying nozzle.
Figure 10:
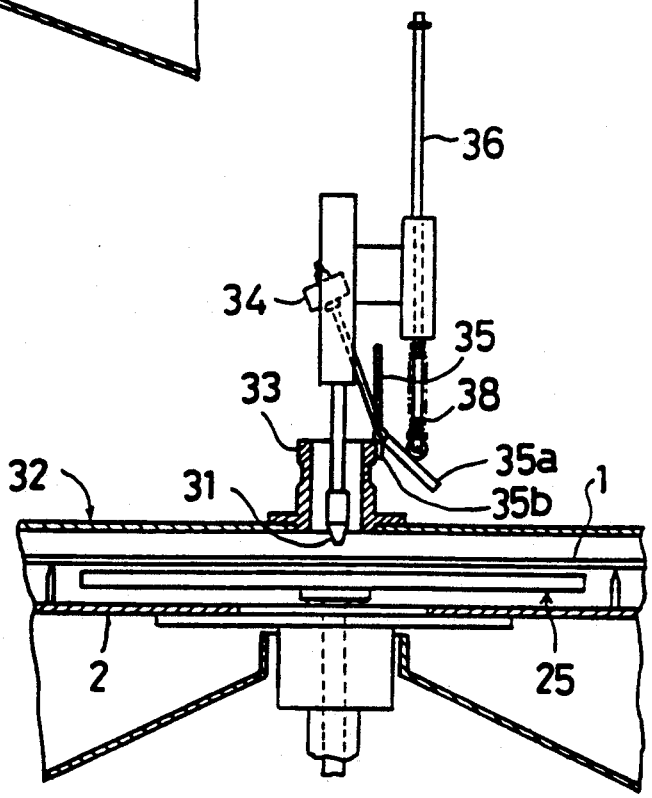

In this construction, the upper rotary plate 3 includes a tubular coating solution supply opening 33 disposed centrally thereof. This supply opening 33 is normally closed by a lid 35 which is urged to a closed position by a weight 34. When a coating solution supply nozzle 31 disposed upwardly of the supply opening 33 is lowered, a roller 37 attached to the lower end of a push rod 36 descending with the nozzle 31 contacts an opener lever 35a connected to the lid 35, thereby to swing open the lid 35 as shown in FIG. 9. The lid 35 is swung only to a certain open position, with a stopper 35b continuous therewith contacting an outer wall of the supply opening 33. In this state, the nozzle 31 is further lowered into the supply opening 33. Then, as shown in FIG. 10, the push rod 33 contacting and supported by the opener lever 35a in the fixed state slides upwardly relative to the nozzle 31 against a spring 38. When the nozzle 31 is raised after supplying the coating solution, the above operation is reversed to cause the lid 35 to automatically close the supply opening 33.

Figure 11:
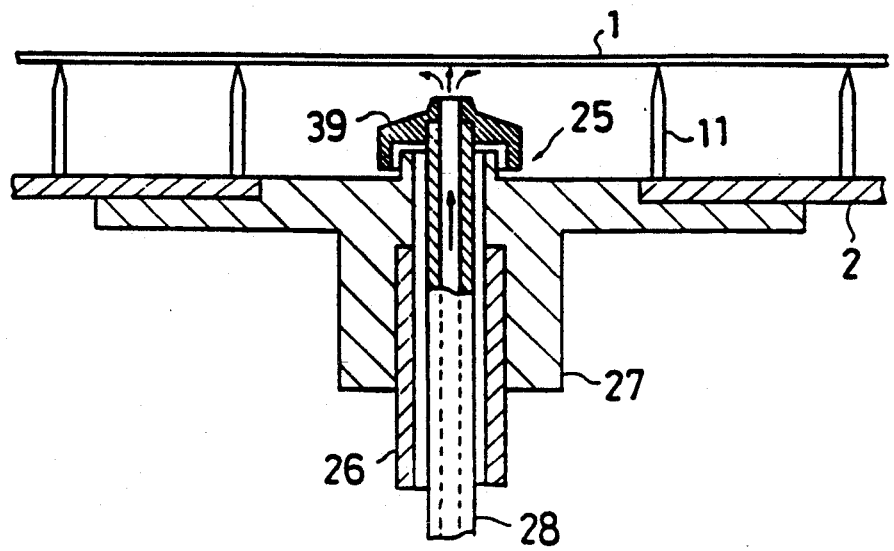
FIG. 11 is a fragmentary view in vertical section of a modified cleaning liquid supply mechanism.

The cleaning liquid supply mechanism 25 may be modified in various ways as follows:

As shown in FIG. 11, for example, a one-hole nozzle 39 may be used instead of the nozzle plate 29.

Figure 12:
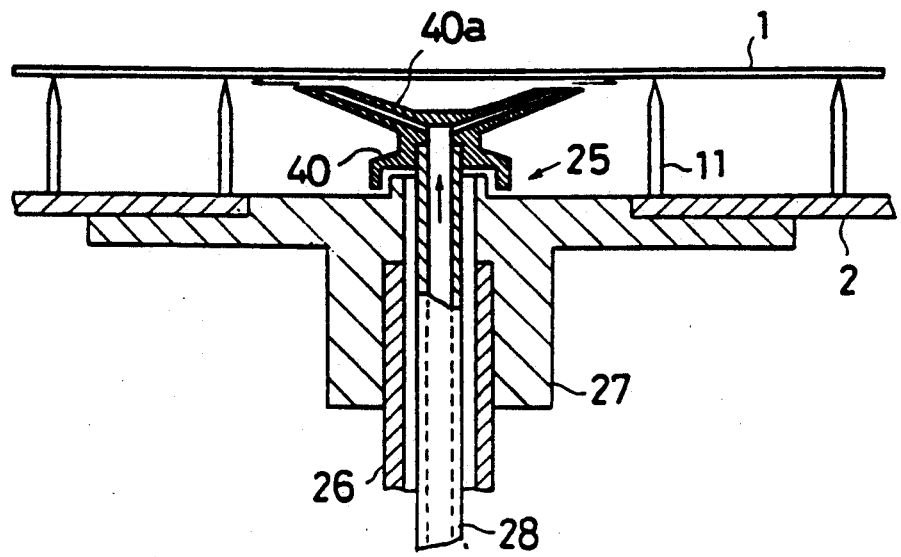
FIG. 12 is a fragmentary view in vertical section of another modified cleaning liquid supply mechanism.
Figure 13:
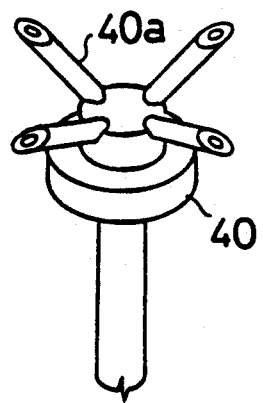
FIG. 13 is a perspective view of a nozzle shown in FIG. 12.

As shown in FIGS. 12 and 13, the nozzle plate 29 may be replaced with a nozzle 40 having a plurality of nozzle pipes 40a.

Further, as shown in FIGS. 14 and 15, a nozzle plate 42 defining supply openings only peripherally thereof may be used to direct the cleaning liquid to peripheral regions of the lower surface of the substrate 1, so that the cleaning liquid will flow radially outwardly from the peripheral regions. Such flows of the cleaning liquid will sweep and clean from the peripheral regions to outer edges of the substrate 1, and effectively prevent entry of the scattered superfluous coating solution to the center of the substrate 1.

Figure 16:
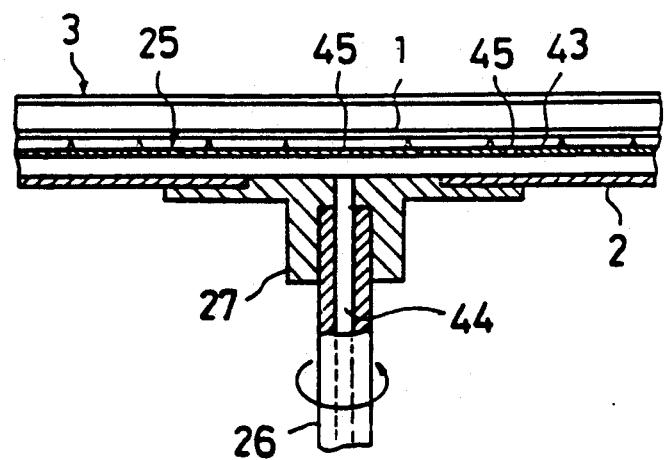
FIG. 16 is a fragmentary view in vertical section of a still further modified cleaning liquid supply mechanism.

FIG. 16 shows yet another modification in which a rotatable nozzle plate 43 is connected to a top center region of the rotary table 2. The cleaning liquid is delivered to the interior of the nozzle plate 43 through a supply duct 44 defined in the vertical rotary shaft 26, and directed to the lower surface of the substrate 1 through supply openings 45 formed in the upper surface of the nozzle plate 43.

As in the first embodiment, the spacer ring 14 interconnecting the rotary table 2 and upper rotary plate 3 may be replaced with the spacer pipes 24 shown in FIG. 4, to open substantially an entire circumferential length of the treatment space S.

The supply duct 44 in the vertical rotary shaft 26 may be used temporarily to supply a gas such as nitrogen gas or clean air besides supplying the cleaning liquid.

The present invention may be embodied in other specific forms without departing from the spirit or essential attributes thereof and, accordingly, reference should be made to the appended claims, rather than to the foregoing specification, as indicating the scope of the invention.

What is claimed is:

1. A spin coating apparatus for applying a coating solution to form an even film on an upper surface of a substrate, comprising:
   means for supplying a flow of said coating solution to said upper surface of said substrate;
   lower spin means for supporting and spinning said substrate in a horizontal posture about a spin axis, said lower spin means having a size larger than an outline contour of said substrate; and
   upper spin means for providing a planar portion having a size larger than the outline contour of said substrate and disposed parallel to and slightly spaced from the upper surface of said substrate supported on said lower spin means, said upper spin means being rotatable about said spin axis with said lower spin means, wherein said substrate is supported to extend across said spin axis of said lower spin means and said upper spin means; and
   wherein said lower spin means and said upper spin means cooperate to define a flat treating space therebetween, said flat treating space having a size larger than the outline contour of said substrate and having peripheral openings for allowing a superfluous part of said coating solution flow to scatter outwardly therefrom.

2. A spin coating apparatus as claimed in claim 1, wherein:
   said substrate is a square substrate, said spin means is a rotary table, and said upper spin means is an upper rotary plate, said square substrate being supported horizontally on a plurality of substrate supporting pins erected on said rotary table, corners of said substrate being engaged by engaging pins erected on said rotary table, whereby said substrate spins horizontally with said rotary table.

3. A spin coating apparatus for use in applying a coating solution in film form to an upper surface of a substrate, comprising:
   means for supplying a flow of a coating solution to said upper surface of said substrate;
   spin means for spinning said substrate as supported thereon in horizontal posture, said pin means having a size larger than a size corresponding to an outline contour of said substrate; and
   upper spin means disposed parallel to and slightly spaced from the upper surface of said substrate supported on said spin means, said upper spin means being rotatable with said spin means and including a planar portion having a size larger than the outline contour of said substrate, wherein
   said spin means and said upper spin means define a flat treating space therebetween, said treating space having peripheral openings for allowing a superfluous part of said coating solution flow to scatter outwardly therefrom,
   said substrate is a square substrate, said spin means is a rotary table, and said upper spin means is an upper rotary plate, said square substrate being supported horizontally on a plurality of substrate supporting pins erected on said rotary table, corners of said substrate being engaged by engaging pins erected on said rotary table, whereby said substrate spins horizontally with said rotary table, and
   said rotary table has a spacer ring and a ring plate connected in the stated order to peripheral position on an upper surface of said rotary table, gaps being formed between the upper surface of said rotary table and a lower surface of said spacer ring and between an upper surface of said spacer ring and a lower surface of said ring plate for allowing the superfluous part of said coating solution to scatter outwardly, said upper rotary plate being connected to and supported by an upper support plate detachably attached to said ring plate.

4. A spin coating apparatus as claimed in claim 2 wherein:
   said rotary table has a ring plate connected thereto by spacer pipes, said upper rotary plate being connected to and supported by an upper support plate detachably attached to said ring plate.

5. A spin coating apparatus for applying a flow of a coating solution to form an even film on an upper surface of a substrate and for cleaning a lower surface of the substrate, comprising:
   lower spin means, having a spin axis, for spinning said substrate while supporting the substrate thereon in a horizontal posture, said lower spin means having a rotary shaft and being of a size larger than an outline contour of said substrate, said substrate extending across said spin axis;

substrate supporting means on said lower spin means to define a space between an upper surface of said lower spin means and the lower surface of said substrate;

upper spin means disposed parallel to and slightly spaced from the upper surface of said substrate supported on said substrate supporting means, said upper spin means being rotatable with said lower spin means about said spin axis and including a planar portion having a size larger than the outline contour of said substrate; and cleaning liquid supply means for supplying a flow of a cleaning liquid through said rotary shaft of said lower spin means and for directing the flow of cleaning liquid to the lower surface of said substrate supported on said substrate supporting means, wherein said lower spin means and said upper spin means cooperate to define a rotating flat treating space therebetween, said treating space having a size larger than the outline contour of said substrate and having peripheral openings for allowing a superfluous part of said coating solution flow to scatter outwardly therefrom.

6. A spin coating apparatus as claimed in claim 5, wherein:

said cleaning liquid supply means includes a cleaning liquid supply tube nonrotatably extending through said rotary shaft, and a nozzle plate communicating with an upper end of said cleaning liquid supply tube, said nozzle plate defining a plurality of cleaning liquid supply openings over an entire upper surface thereof.

7. A spin coating apparatus as claimed in claim 5, wherein:

cleaning liquid supply means includes a cleaning liquid supply tube extending through said rotary shaft, and a hollow nozzle plate communicating with an upper end of said cleaning liquid supply tube, said nozzle plate defining a plurality of cleaning liquid supply openings along a peripheral region thereof for directing the cleaning liquid radially outwardly.

8. A spin coating apparatus as claimed in claim 5, wherein:

said cleaning liquid supply means includes a cleaning liquid supply tube extending through said rotary shaft, and a one-hole nozzle connected to an upper end of said cleaning liquid supply tube for directing the cleaning liquid toward a center region of the lower surface of said substrate.

9. A spin coating apparatus as claimed in claim 5, wherein:

said cleaning liquid supply means includes a cleaning liquid supply tube extending through said rotary shaft, and a plurality of nozzle pipes connected to an upper end of said cleaning liquid supply tube for directing the cleaning liquid toward a center region and radially outwardly of the lower surface of said substrate.

10. A spin coating apparatus as claimed in claim 5, wherein:

said cleaning liquid supply means includes a nozzle plate rotatable with said spin means for receiving the cleaning liquid through said rotary shaft and directing the cleaning liquid to the lower surface of said substrate through cleaning liquid supply openings defined in said nozzle plate.

11. A spin coating apparatus for use in applying a coating solution in film form to an upper surface of a substrate, said apparatus comprising:

spin means for spinning said substrate as supported thereon in horizontal posture, said spin means having a size larger than an outline contour of said substrate;

substrate supporting means formed on said spin means to define a space between an upper surface of said spin means and a lower surface of said substrate;

upper spin means disposed parallel to and slightly spaced from an upper surface of said substrate supported on said substrate supporting means, said upper spin means being rotatable with said spin means and including a planar portion having a size larger than the outline contour of said substrate; and cleaning liquid supply means for supplying cleaning liquid through a rotary shaft of said spin means and directing the cleaning liquid to the lower surface of said substrate supported on said substrate supporting means, wherein a coating solution supply opening is formed centrally of said upper spin means for retractably receiving a coating solution supply nozzle, and a lid is provided to be operable with movement of said coating solution supply nozzle to open and close said coating solution supply opening.

* * * * *